(12) United States Patent
Cengarle et al.

(10) Patent No.: US 11,206,001 B2
(45) Date of Patent: Dec. 21, 2021

(54) INFERENCE AND CORRECTION OF AUTOMATIC GAIN COMPENSATION

(71) Applicant: Dolby International AB, Zuidoost (NL)

(72) Inventors: Giulio Cengarle, Barcelona (ES); Antonio Mateos Sole, Barcelona (ES)

(73) Assignee: Dolby International AB, Amsterdam Zuidoost (NL)

( * ) Notice: Subject to any disclaimer, the term of this patent is extended or adjusted under 35 U.S.C. 154(b) by 0 days.

(21) Appl. No.: 16/651,280

(22) PCT Filed: Sep. 26, 2018

(86) PCT No.: PCT/EP2018/076131
§ 371 (c)(1),
(2) Date: Mar. 26, 2020

(87) PCT Pub. No.: WO2019/063615
PCT Pub. Date: Apr. 4, 2019

(65) Prior Publication Data
US 2020/0274509 A1 Aug. 27, 2020

Related U.S. Application Data

(60) Provisional application No. 62/591,258, filed on Nov. 28, 2017.

(30) Foreign Application Priority Data

Sep. 27, 2017 (ES) .................................. P201731153
Nov. 28, 2017 (EP) ...................................... 17204135

(51) Int. Cl.
*H03G 3/00* (2006.01)
*H03G 3/30* (2006.01)
(Continued)

(52) U.S. Cl.
CPC ........... *H03G 3/3005* (2013.01); *H03G 7/002* (2013.01); *H04R 3/00* (2013.01); *H04R 29/001* (2013.01); *H03G 2201/103* (2013.01)

(58) Field of Classification Search
CPC .................................. H04R 3/00; H03G 7/008
(Continued)

(56) References Cited

U.S. PATENT DOCUMENTS 1,137,448 A 4/1915 Anderson
5,557,237 A 9/1996 Carpentier
(Continued)

FOREIGN PATENT DOCUMENTS

| DE | 4122004 | 1/1993 |
| EP | 2983063 | 2/2016 |
| GB | 1137448 | 12/1968 |

*Primary Examiner* — Katherine A Faley (57) ABSTRACT

Methods, systems, and computer program products that infer and correct automatic gain compensation (AGC) values over time are described. A device emits a series of inaudible reference audio signals during recording. The reference audio signals have a constant amplitude. A microphone of the device records the reference audio signals while recording audio content. The device may apply AGC during the recording. An AGC inference module receives the recorded signals and extracts a representation of the reference audio signals, which have been subject to the AGC. The AGC inference module determines variations in levels of the extracted representation of the reference audio signals over time. Based on the variations, the AGC inference module infers the AGC applied to the recording over time. The AGC inference module can then provide the AGC for reading, or undo effects of the AGC applied to the audio content.

16 Claims, 8 Drawing Sheets

(51) Int. Cl.
*H03G 7/00* (2006.01)
*H04R 3/00* (2006.01)
*H04R 29/00* (2006.01)

(58) Field of Classification Search
USPC .......................................................... 381/107
See application file for complete search history.

(56) References Cited

U.S. PATENT DOCUMENTS

| | | |
|---|---|---|
| 6,134,430 A | 10/2000 | Younis |
| 7,573,410 B1 | 8/2009 | Georgantas |
| 8,433,268 B2 | 4/2013 | Jung |
| 8,645,094 B2 | 2/2014 | Rossi |
| 9,225,822 B2 | 12/2015 | Davis |
| 9,413,321 B2 | 8/2016 | Bongiovi |
| 2002/0061738 A1* | 5/2002 | Simmons ................. H03G 7/06 455/234.1 |
| 2006/0216042 A1 | 9/2006 | Yeo |
| 2016/0099001 A1 | 4/2016 | Peters |
| 2017/0092289 A1 | 3/2017 | Suzuki |

\* cited by examiner

INFERENCE AND CORRECTION OF AUTOMATIC GAIN COMPENSATION

CROSS-REFERENCE TO RELATED APPLICATIONS

This application claims priority of the following priority applications: ES patent application P201731153 (reference: D17024ES), filed 27 Sep. 2017 and U.S. provisional application 62/591,258 (reference: D17024US), filed 28 Nov. 2017 and EP application 17204135.2 (reference: D17024EP), filed 28 Nov. 2017, which are hereby incorporated by reference.

TECHNICAL FIELD

This disclosure relates generally to audio signal processing.

BACKGROUND

A system implementing automatic gain compensation (AGC), also referred to as automatic gain control, receives variable signal levels as input and provides adjusted, e.g., flattened, signal levels as output. Typically, AGC has the effect of reducing strong signals and enhancing weak signals. AGC may be desirable in some applications, e.g., speech recording, but undesirable in some applications, e.g., music recording. Some modern mobile devices, e.g., some smartphones, are configured to apply AGC to all audio recordings. In such devices, the AGC may or may not be enabled at operating system level. These devices may lack an interface for applications running on the devices to adjust the system-level AGC. In addition, these devices may not provide information to the applications on how much AGC was applied. In various circumstances, e.g., during live music recording, being able to control, or at least read, AGC gains is desirable. In particular, in music recording, it may be desirable to record all signals disabling AGC, or undoing any AGC applied, so that music-specific sophisticated dynamics processing can be applied either to each recorded signal, or to a mix of them.

GB Patent No. 1,137,448 discloses a system where an ultrasonic pilot tone is used to control the amplification of audio signals emitted by a speaker. To this end, the speaker carries a transducer for the ultrasonic pilot tone and the amplification is controlled so that the amplified pilot tone has a constant level, irrespective of the speaker's position in relation to a microphone. Thus also the volume of the speaker's voice is maintained constant.

SUMMARY

Techniques that infer AGC values and undo AGC effects over time are described. A device, e.g., a smart phone or a tablet computer, emits a series of reference audio signals during recording. The reference audio signals have frequencies that are inaudible to humans, e.g., beyond human hearing range. A microphone of the device records the reference audio signals while recording audio content. The device may apply AGC during the recording. An AGC inference module receives the recorded signals and extracts a representation of the reference audio signals, which have been subject to the AGC. The AGC inference module determines variations in levels of the extracted representation of the reference audio signals over time. Based on the variations, the AGC inference module infers the AGC applied to the recording over time. The AGC inference module can then provide the AGC to a consuming device. The consuming device can undo effects of the AGC applied to the audio content.

A method for determining a time-varying gain applied to audio content during recording is disclosed. The method comprises, on a device capturing the audio content, generating reference audio signals that are, while the audio content is present, inaudible to humans; driving a loudspeaker, coupled to the device, to emit the reference audio signals; and simultaneously capturing as captured signals the audio content and the reference audio signals. In embodiments, the reference audio signals are emitted at the same level, i.e. with the same signal power. The capturing may be through a microphone and an associated Analog-to-Digital converter coupled to the device. The capturing includes applying a common time-varying gain to a signal comprising the audio content and the reference audio signals. The method further comprises extracting a representation of the reference audio signals from the captured signals (that have been subject to the time-varying gain); determining variations over time in levels of the representation of the extracted reference audio signals; and inferring, from the variations in levels, the time-varying gain that has been applied to the audio content during the capturing. The previous steps may all be performed on the device mentioned above. The representation of the extracted reference audio signals may include a series of impulse responses corresponding to the reference audio signals. The determined levels of the representation of the reference audio signals (e.g. amplitudes of the impulse responses) include information on the amount of the time-varying gain applied to the reference audio signals and the audio content at each time. For example, the levels of the representation may be inversely proportional to the applied gains at the corresponding time instant. The method may further include providing information (e.g. a signal or values) on the inferred time-varying gain to another device, e.g. a consuming device that may also receive the audio content. The consuming device may then undo effects of the applied time-varying gain on the audio content by applying a corresponding inverse gain to the audio content.

Furthermore, a device for determining a time-varying gain applied to audio content during recording is disclosed. The device comprises a reference signal generator configured to generate reference audio signals that are, while the audio content is present, inaudible to humans, for emission through a loudspeaker coupled to the device, a recording interface configured to receive captured signals comprising the audio content and the reference audio signals after the time-varying gain has been concurrently applied to the audio content and the reference audio signals; a reference signal extractor configured to determine a representation of the reference audio signals from the captured signals; and a gain analyzer configured to infer the time-varying gain that has been applied to the audio content during the recording from levels of the representation of the reference audio signals. The captured signals may be received through a microphone and an associated Analog-to-Digital converter coupled to the device. The device may further comprise a gain output configured to output a signal representative of the time-varying gain, e.g. to a consuming device that also receives the audio content. Alternatively, a gain interface may be provided on the device to provide information on the gain applied to the audio content to other components of the device which further process the audio content, e.g. by undoing the effects of the applied time-varying gain on the audio content. In a similar way, the recording interface may be a software interface within the device. The device may further comprise a speaker driver receiving the reference audio signals and configured to drive the loudspeaker coupled to the device for emission of the reference audio signals. The loudspeaker, the microphone and the Analog-to-Digital converter may be part of the device, e.g. carried by a housing of the device that also carries a processor that is configured to implement the above mentioned device components. In embodiments, loudspeaker and/or microphone may be coupled by wire (e.g. via USB cable) or wireless (e.g. via short range communication means such as Bluetooth™) with the device.

The features described in this specification can achieve one or more advantages over conventional audio recording technologies. The features improve upon conventional audio recording techniques where system-level AGC is forced upon audio content by a system and is unmanageable by application programs. By undoing effects of the system-level AGC, the disclosed techniques improve fidelity of a recording. For example, when recording live music with high dynamic range, system-level AGC may flatten levels of the recording such that quiet passages are enhanced and loud passages are reduced, modifying the original intended dynamics of a performance. The disclosed techniques can undo the effects of the system-level AGC and restore the original intended dynamics. The disclosed techniques obviate needs to design different inference algorithms for different device and operating system combinations. The disclosed techniques do not rely on factory calibration of each device or individual terminal for removing the AGC. The disclosed techniques do not require specialized hardware for removing the AGC, because, for example, the disclosed techniques can be implemented on a consumer smartphone, and most consumer smart phones are able to emit and record signals beyond 20 kHz. The disclosed techniques do not need to run a dedicated calibration process that may prevent a device from operating normally, or from continuing a recording. The disclosed techniques give a user, or an audio processing application program, more control over audio recording.

The details of one or more implementations of the disclosed subject matter are set forth in the accompanying drawings and the description below. Other features, aspects and advantages of the disclosed subject matter will become apparent from the description, the drawings and the claims.

BRIEF DESCRIPTION OF THE DRAWINGS

Like reference symbols in the various drawings indicate like elements.

DETAILED DESCRIPTION

Example Device

Figure 1:
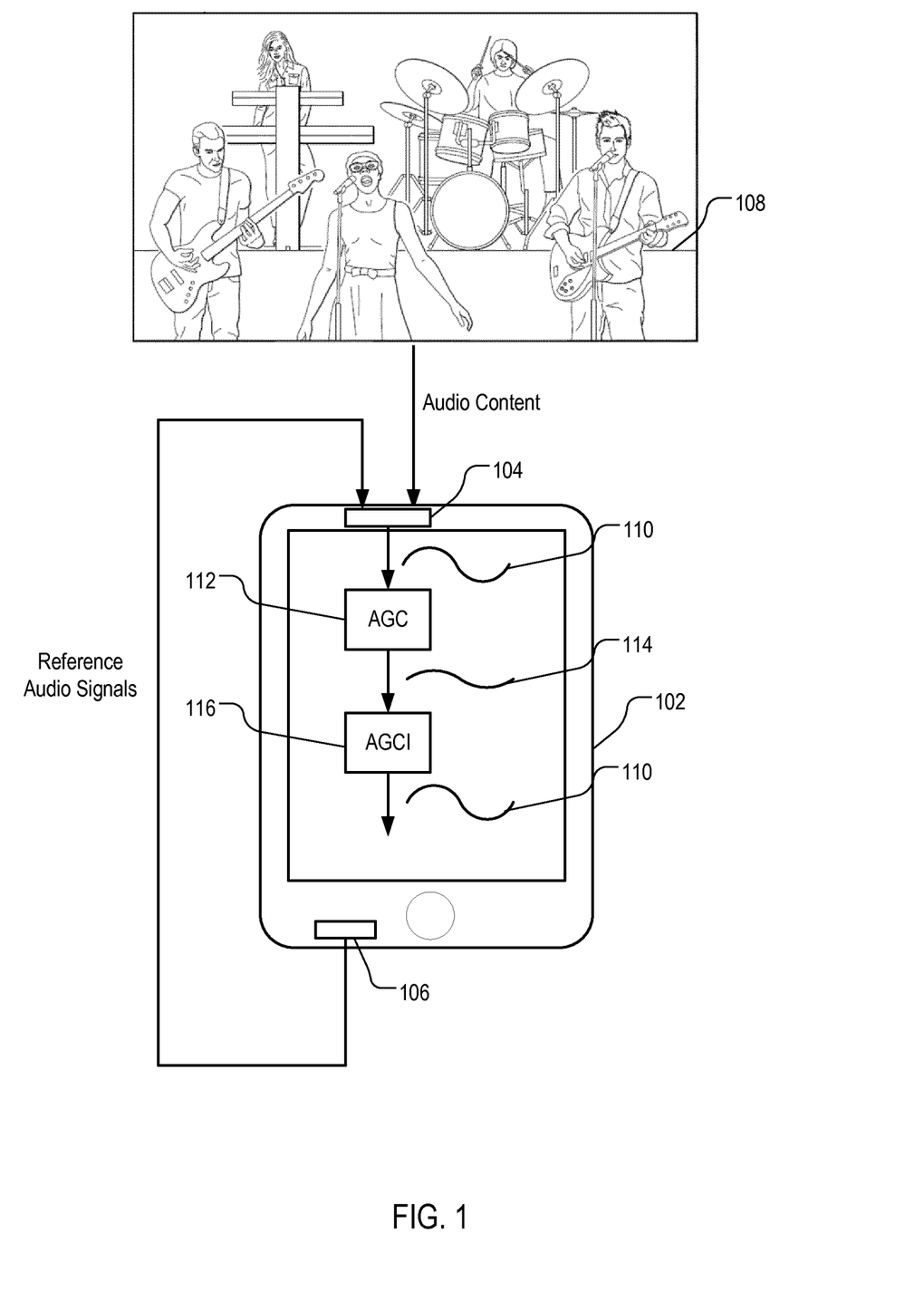
FIG. 1 is a diagram illustrating an example device implementing AGC inference and correction.

FIG. 1 is a diagram illustrating an example device 102 implementing AGC inference and correction. The device 102 is a computing device including one or more processors. For example, the device 102 can be a mobile device such as a tablet computer or a smartphone. The device 102 can be coupled to, e.g., include or be connected to, a microphone 104 and a loudspeaker 106. In various implementations, the device 102 can be coupled to multiple microphones and loudspeakers. For example, the device 102 can be plugged into, or wirelessly connected to, stereo microphones and loudspeakers. The device 102 is configured to record audio content of an event 108. The event 108 can be any event where audio content (e.g., speech, vocal music or instrumental music) is produced. For example, the event 108 can be a live performance event, e.g., a concert, in which one or more musical instruments and/or one or more vocalists perform.

During recording, the device 102 emits a series of reference audio signals from the loudspeaker 106. Each of the reference audio signals can be a signal that has a frequency range beyond human hearing range, e.g., above 20 kHz. Each of the reference audio signals can have a pre-configured or real time-determined duration, e.g., one second. The device 102 can emit the reference audio signals at a recurrence rate that is configurable, e.g., once every two seconds. The recurrence rate corresponds to a desired AGC inference resolution. Levels of the emitted reference audio signals are uniform across the series. The levels are low compared to levels of the audio content of the event 100, but are above a noise floor. Each reference audio signal can be a linear or exponential sweep. Reference audio signals can also be narrow-band noise, e.g. between 20 KHz and 22 KHz, emitted continuously or in bursts. Other non-hearable reference signals known in the state of the art to be suitable for loudness estimation can be used.

The microphone 104 picks up both the audio content and the reference audio signals. The signals arriving at the microphone, including both the audio content and reference audio signals, may have a first dynamic range 110. The device 102 includes an AGC module 112. The AGC module 112 applies AGC to the arriving signals, producing AGC-processed signals. The AGC module 112 may include a submodule that analyses the power level of arriving sounds and in response continuously determines a time-varying gain. Another AGC submodule receives the currently determined AGC gain value and modifies the arriving signals according to the gain value, thereby changing the overall gain of the signals. For example, the AGC module 112 can reduce loud sections of the arriving signals and/or enhance quiet sections of the arriving signals. After being processed by the AGC module 112, the AGC-processed signals can have a second dynamic range 114, possibly different from that of the arriving signals. The arriving audio signals may be flattened by the AGC module 112, where the second dynamic range 114 is less than the first dynamic range 110. The device 102 may prevent a user or an application from accessing or manipulating the AGC module 112, and from reading the amount of the AGC applied to the signals. In some implementations, the microphone 104 itself has a hardware, software, or firmware component that applies AGC to arriving signals and outputs AGC-processed signals. In such cases, the AGC module 112 may not be necessary.

The device 102 can be coupled to an AGC inference module 116 configured to determine, and optionally undo, the AGC applied to the signals by the AGC module 112. The AGC inference module 116 is a component that is included in, or is connected to, the device 102. In some implementations, functions of the AGC inference module 116 can be performed by a cloud-based service that is connected to the device 102 through the Internet. The AGC inference module 116 receives the AGC-processed signals from the AGC module 112. The AGC inference module 116 processes the AGC-processed signals, for example, in the case where the reference signals were exponential sweeps, by convolving the AGC-processed signals with an inverse sweep. The convolution turns each reference audio signal into an easily identifiable impulse response (IR), and filters out the audible audio picked-up by the microphone. The AGC applied by the AGC module 112 may cause levels of the IRs in a time sequence to vary. Given that the original reference audio signals were emitted at the same level, the AGC inference module 116 can deduce the gain applied to the microphone 104 by the AGC module 112 from the respective level of each IR in the sequence. The deduced gain can be a time sequence that corresponds to the sequence of the reference audio signals. The deduced gain is relative, it describes the evolution of the initial unknown absolute gain over time. The absolute gain applied to a recorded signal passing through different domains such as digital signals, analogue voltages, electroacoustic transducers, the air, etc. depends on a number of unknown parameters, many beyond AGC. For a compensation of AGC effects, it is not necessary to know the absolute gain. All what must be known is if such gain varies over time (due to the AGC) and how much it varies. This allows undoing the AGC effects and restoring a signal with original dynamics (possibly on a different average signal level).

The AGC inference module 116 can provide the sequence of deduced gains to a consuming device, which can be a server or a component of the device 102. Optionally, the consuming device or the AGC inference module 116 can apply an inverse of the sequence of deduced gain to the audio content, undoing the effect of the AGC applied to the audio content by the AGC module 112. Undoing the effect of the AGC can result in restoring the original dynamic range 110 of the arriving signals, which can be desirable in various scenarios, e.g., in recording music of the event 108.

Example Signals

Figure 2:
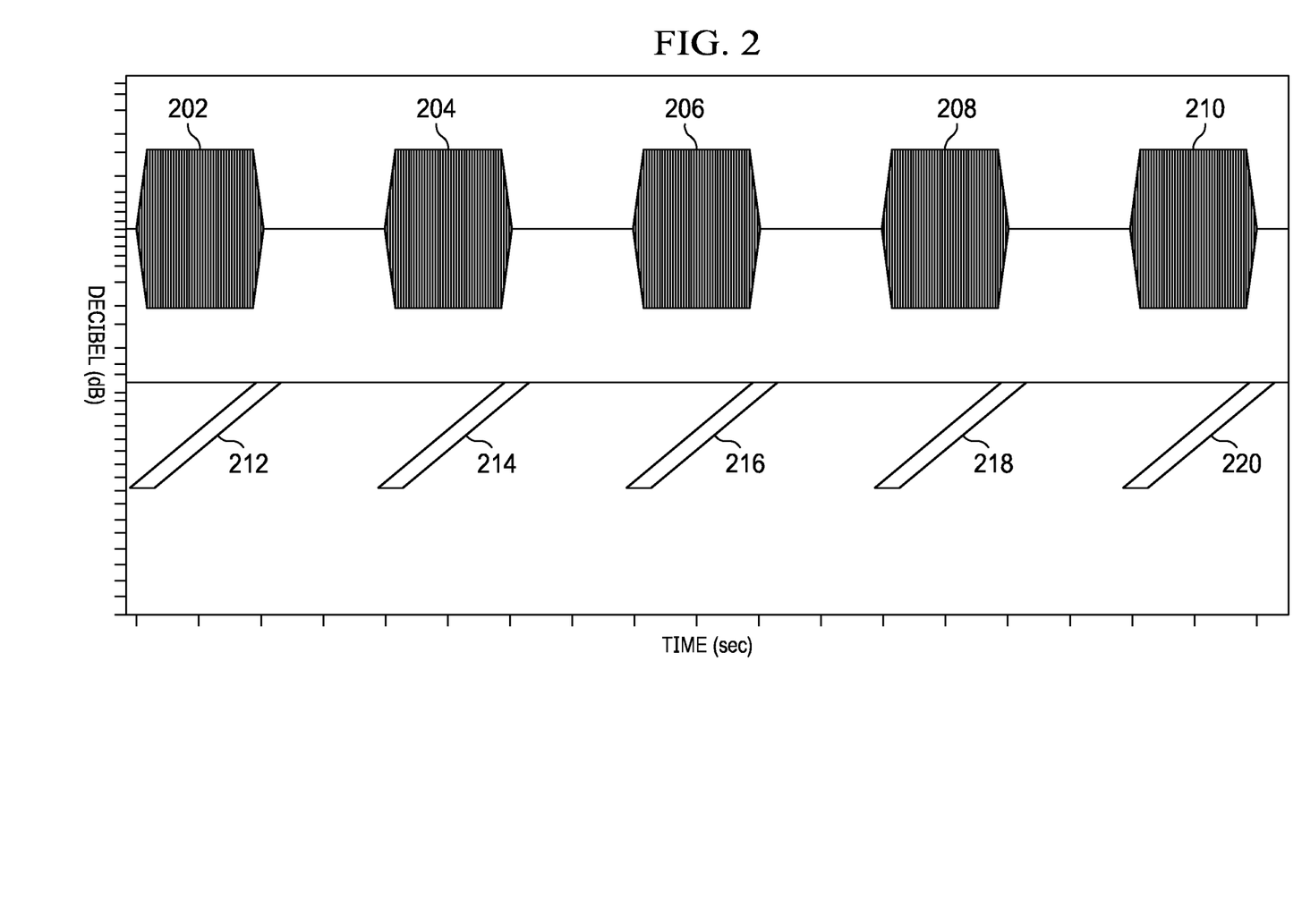
FIG. 2 is a diagram illustrating an example series of reference audio signals.

FIG. 2 is a diagram illustrating an example series of reference audio signals. For simplicity and convenience, a time series of five reference audio signals are shown. The horizontal axis represents time, in seconds. In the top portion of FIG. 2, the vertical axis represents levels, in decibel (dB). Waveforms 202, 204, 206, 208 and 210 representing the five reference audio signals are shown. In the bottom portion of FIG. 2, the vertical axis represents frequency, in Hertz (Hz). Spectrograms 212, 214, 216, 218 and 220 represent frequencies of the five reference audio signals. The reference audio signals can be emitted by a loudspeaker, e.g., the loudspeaker 106 of the device 102 of FIG. 1.

For frequencies of the reference audio signals, the device can choose any frequency that is outside of audible frequency range of human beings, playable by a loudspeaker, and can be effectively picked up by a nearby microphone. In some implementations, the frequency can be above human hearing range and below one half of sampling rate of a loudspeaker. For example, for a device having an internal loudspeaker operating at sampling rate of 48 kHz, the device can choose sine-wave sweeps covering the frequency range between upper limit of audible frequency, e.g., 20 kHz, to half of the sampling rate, e.g., 24 kHz, for the reference audio signals. The frequency response of the internal loudspeaker is sufficient to be effectively picked up by a close-by microphone. In some implementations, the sweeps are linear sweeps. In some implementations, the sweeps are exponential sweeps.

For levels of the reference audio signals, the device can choose a level that is above environment noise floor in the same frequency range. As shown in the waveforms 202, 204, 206, 208 and 210, the level is constant across the emission of copies of the reference audio signals. For each reference audio signal, the device can implement a fade in and a fade out. The fade in and fade out, as shown in the beginning and ending edges in each of the waveforms 202, 204, 206, 208 and 210, can avoid audible abrupt transitions at the beginning and end of each reference audio signal.

For duration and recurrence rate, the device can determine how long each reference audio signal lasts and how long the reference audio signals are spaced apart based on a desired AGC resolution that is pre-specified and user configurable. For example, as shown in FIG. 2, the device can determine that the duration of each reference audio signal is one second, and that the loudspeaker shall emit a reference audio signal every two seconds. Shorter or longer duration can be used. Higher or lower recurrence rate can be used. The device can cause the loudspeaker to start emitting the reference audio signal at the frequency, level, duration and recurrence rate in response to determining that recording has started.

Other reference signals can be used. Another example is narrow band noise, for example, between 20 KHz and 24 KHz, which can be emitted either continuously, or in short, repeated bursts, similar to aforementioned sweep reference signals.

Figure 3:
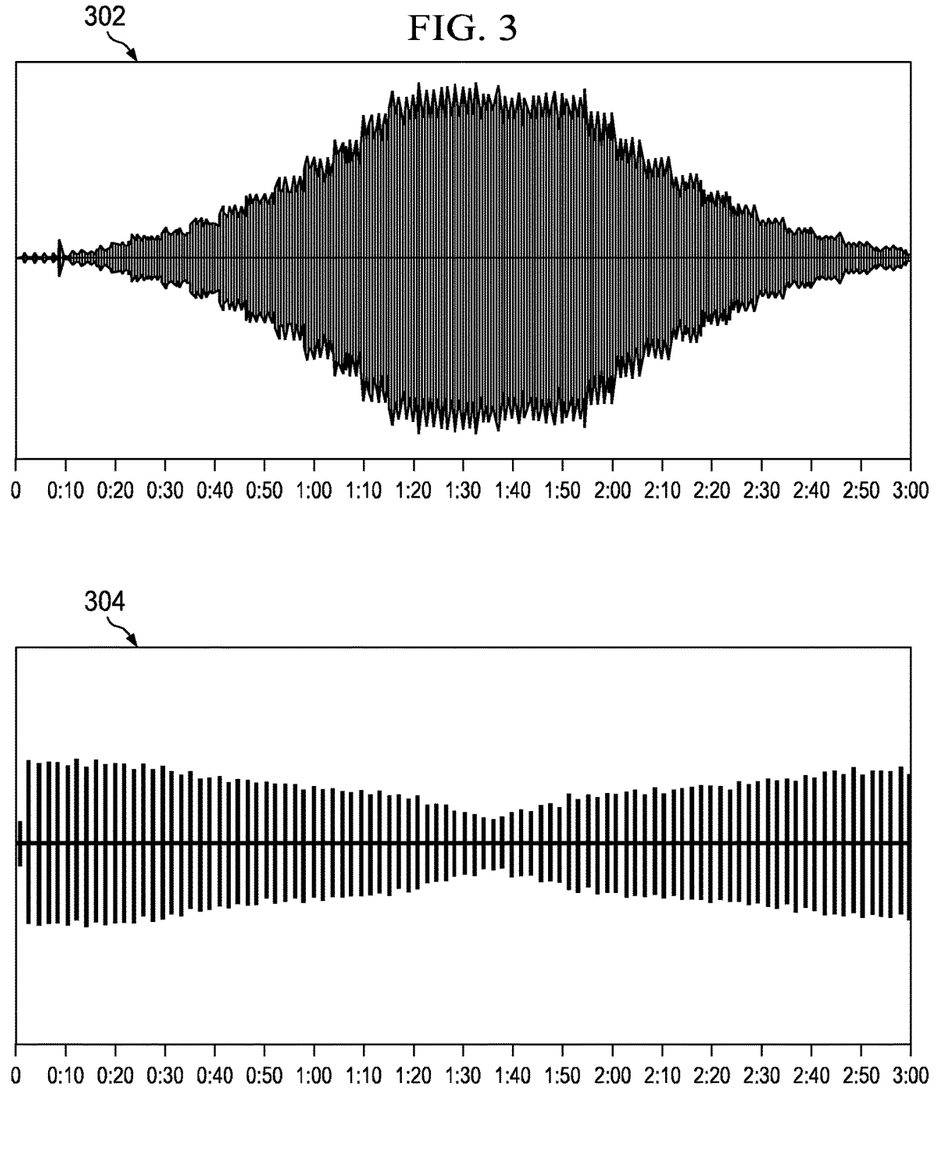
FIG. 3 is a diagram illustrating example recorded audio signals and extracted reference audio signals.

FIG. 3 is a diagram illustrating example recorded audio signals and extracted reference audio signals. A waveform 302 at top portion of FIG. 3 shows recorded audio signals that include audio content, e.g., music performance, speech, ambient noise plus reference audio signals emitted from a loudspeaker. The level of the reference audio signals is low compared to the level of the audio content.

In the example shown, the waveform 302 indicates a steady signal played in a room with a sound source, e.g., one or more loudspeakers, playing audio content. Levels of the signal increase and decrease in discrete steps, as recorded by an internal microphone of a device, e.g., the device 102 of FIG. 1, that implements AGC. As can be seen in the waveform 302, during the loudest parts, the device applies AGC to keep the level constant. While recording the audio content, an internal loudspeaker of the device emits the reference audio signals independent of the levels of the external sound source.

The device processes the recorded audio signals as shown in waveform 302. The processing including convolving the recorded audio signal with inverse sweeps corresponding to the reference audio signals. The convolution filters out spectral components outside of the frequency range of the reference audio signals, and transforms each reference audio signal into a respective impulse response (IR) that is easily identifiable.

A series 304 of IRs extracted from the recorded audio signals are shown in the bottom part of FIG. 3. Given that the reference audio signals were emitted at the same level, the levels of the IRs would be constant if no AGC was applied. As shown in the series 304, the levels of the IRs vary in accordance with respective amounts of AGC at various times. The levels of the IRs are inversely proportional to the amounts of AGC gain changes applied at each time. The device can determine the variation, and deduce the gain change applied to the microphone from the level of each IR in the series 304.

Figure 4:
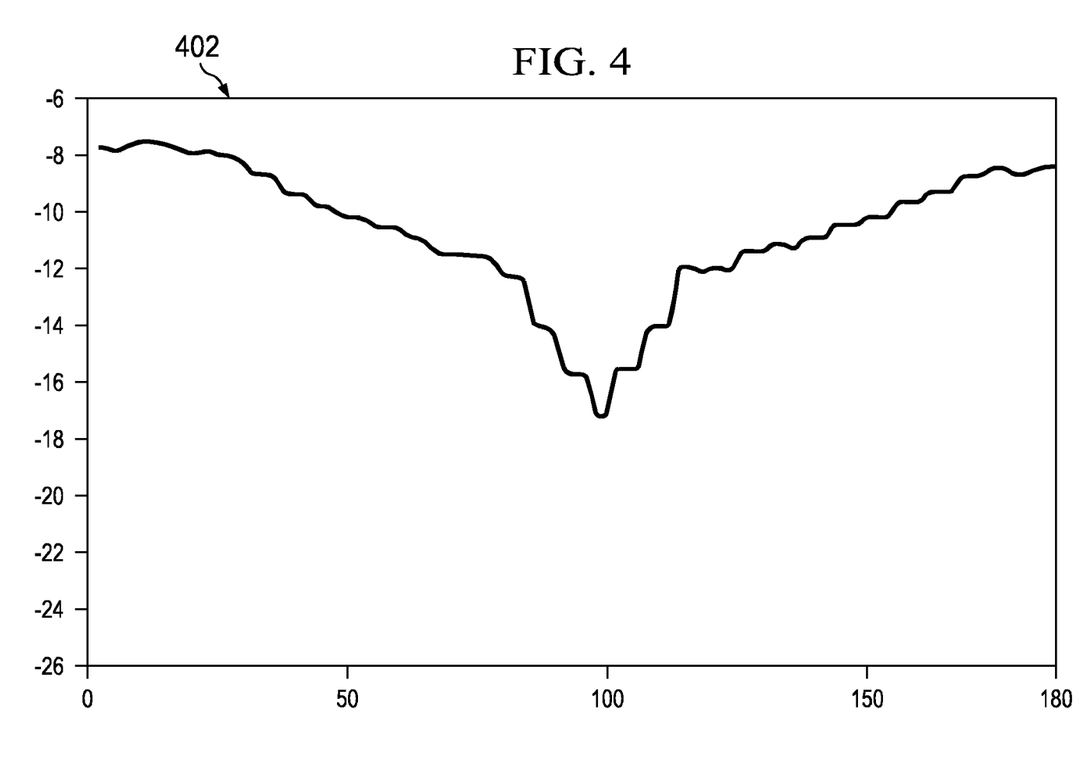
FIG. 4 is a diagram illustrating example AGC gains inferred by a device.

FIG. 4 is a diagram illustrating example AGC gains inferred by a device. In FIG. 4, the horizontal axis represents time, in seconds. The vertical axis represents amount of AGC applied, in dB. The device can determine the AGC 402 applied to the audio content over time. The device can make the determination based on the analysis as described above in reference to FIG. 3. The device can export values of the AGC 402 to a storage device or to another device. The device can apply to recorded audio signals a series of gains that compensate the AGC 402. Compensating the AGC 402 can include increasing the level of the recorded audio signals at a particular time by the amount of AGC applied to the recorded audio signals at that time. The compensation can undo effects of the AGC and restore the recorded audio signals to their original, raw levels.

Figure 5:
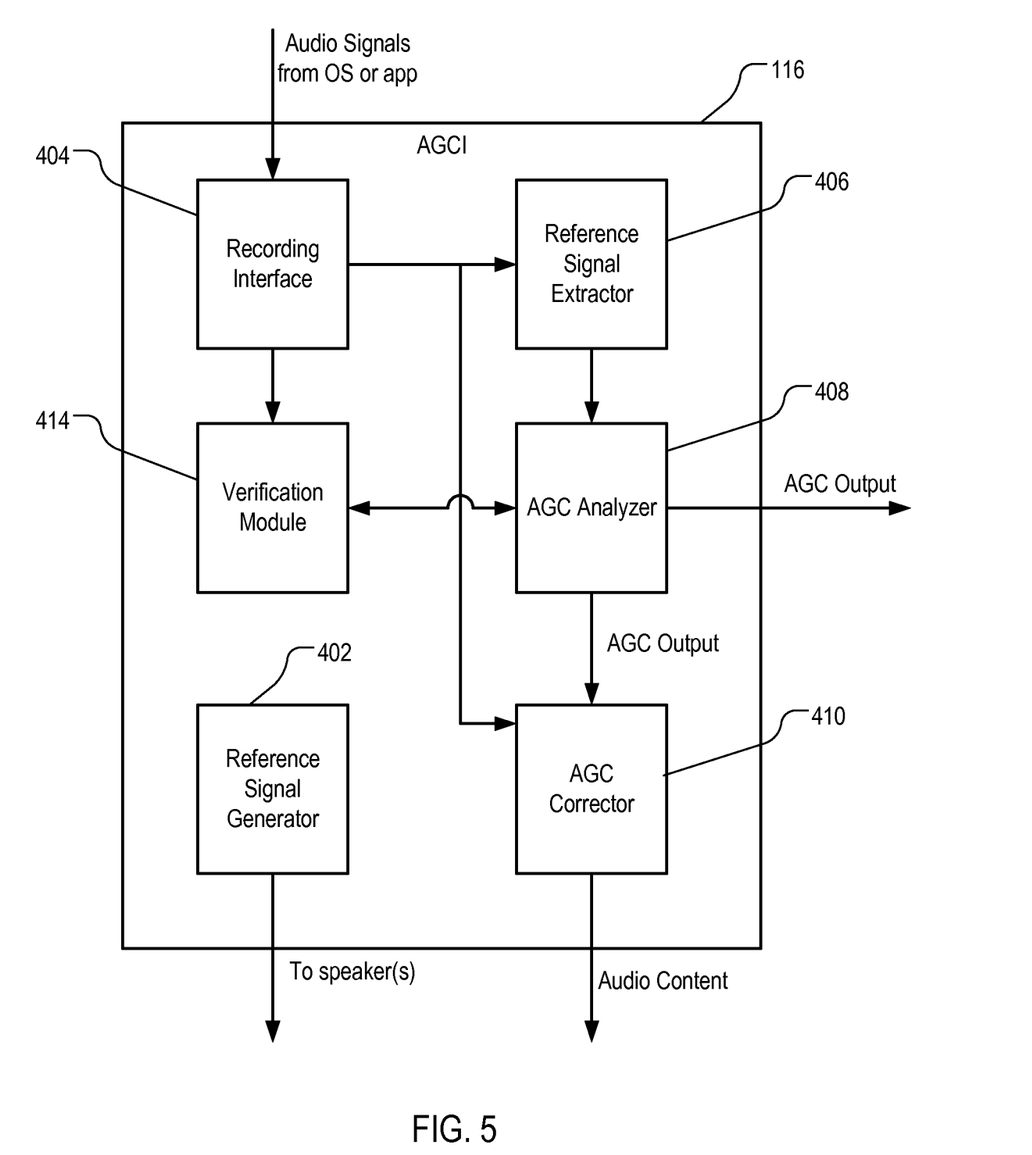
FIG. 5 is a block diagram illustrating an example AGC inference module.

FIG. 5 is a block diagram illustrating an example AGC inference module 116. The AGC inference module 116 includes various components, as described in additional details below. Each component of the AGC inference module 116 can be implemented by one or more computer processors. The AGC inference module 116 can be implemented on a device, e.g., the device 102 of FIG. 1, or one or more servers, e.g., one or more computers in a cloud computing environment.

The AGC inference module 116 includes a reference signal generator 402. The reference signal generator 402 is a component of the AGC inference module 116 configured to generate a time series of reference audio signals. The reference audio signals can be steady signals, e.g., pure tones or bandpassed noise above the upper limit of human hearing's frequency range of 20 kHz. The reference audio signals can be sweeps, e.g., exponential sweeps, that are above or mostly above the upper limit of human hearing's frequency range. The reference signal generator 402 provides the reference audio signals to one or more loudspeakers.

The AGC inference module 116 can include a recording interface 404. The recording interface 404 is a component of the AGC inference module 116 configured to receive audio signals. The recording interface 404 can receive the audio signals that have been subject to AGC applied by system software, e.g., by the operating system, or subject to AGC applied by an AGC-capable microphone, or by an application program. Typically, the role of AGC is to attenuate louder parts of the audio content, rather than boosting soft parts. However, in some cases, AGC may provide signal amplification, too. The present disclosure addresses both cases and provides for a compensation of the AGC effects in both cases.

The recording interface 404 provides the received audio signals to a reference signal extractor 406. The reference signal extractor 406 is a component of the AGC inference module 116 configured to process the received audio signals, including convolving the received audio signals with inverse sweeps, to determine a representation of the reference audio signals, e.g., a corresponding time series of IRs. The reference signal extractor 406 provides the series of IRs to an AGC analyzer 408.

The AGC analyzer 408 is a component of the AGC inference module 116 configured to infer a time series of AGC values applied to the audio signals based on levels of the representation of reference signals received from the reference signal extractor 406. The AGC analyzer 408 can provide the inferred AGC values as an output to a consuming device, or provide the inferred AGC values to an AGC corrector 410.

The AGC corrector 410 is a component of the AGC inference module 116 configured to receive audio signals from the recording interface 404 and receive AGC values from the AGC analyzer 408. The AGC corrector 410 can undo effects of the AGC in the audio signals by applying an inverse of the receive AGC values to the audio signals. The AGC corrector 410 can provide the audio signals, with the AGC effects undone, as an output to a consuming device. The AGC corrector 410 can be designated as a consuming device of the AGC values.

The AGC inference module 116 can include a verification module 414. The verification module 414 is a component of the AGC inference module 116 configured to verify robustness of the AGC inference and correction. The verification module 414 compares the inferred AGC and level of the recorded audio signal against a pre-measured curve of gain change as a function of signal level. The verification can reveal anomalies in the inference. Detecting the anomalies can be useful in determining that the inference is interrupted, e.g., when the emitting loudspeaker was accidentally covered by a user.

In some implementations, the verification module 414 can analyze the levels of the de-convolved IRs. If a level of an IR is below a threshold that corresponds to values of IRs in normal conditions, even with the AGC acting at maximum effect, the verification module 414 can discard this particular IR. The verification module 414 can compare levels of IRs with the recorded audio signals. If, at a given time, the level of the recorded audio signals is in a range where AGC would not have acted, but the level of an IR indicates gain change that is above a given threshold, the verification module 414 can discard this particular IR.

Example Processes

Figure 6:
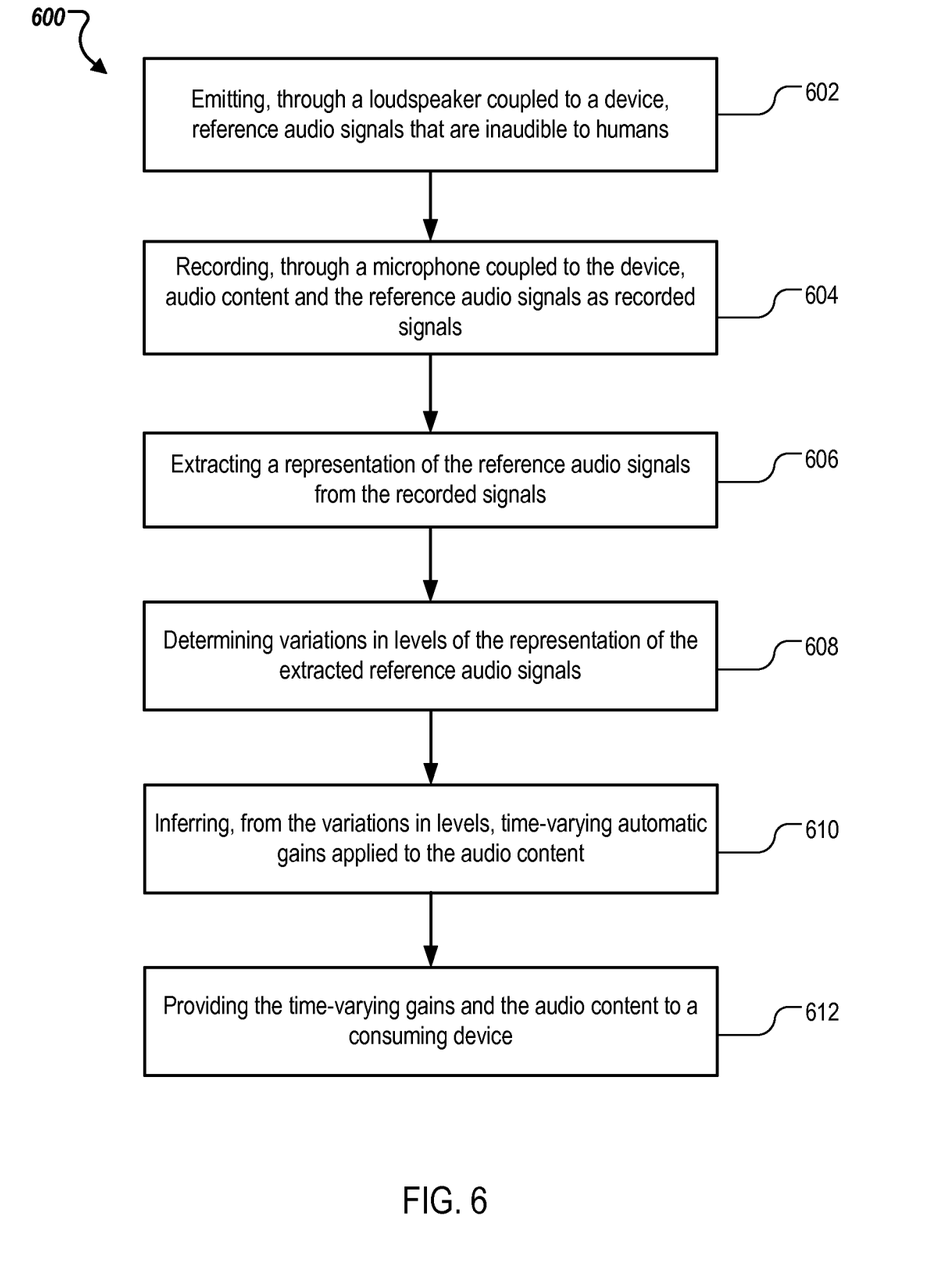
FIG. 6 is a flowchart of an example process of inferring AGC based on reference audio signals.

FIG. 6 is a flowchart of an example process 600 of inferring AGC based on reference audio signals. The process 600 can be performed by a system including one or more computer processors, e.g., the device 102 of FIG. 1, a server system, or any combination of the two.

The system, capturing audio content, emits (602) reference audio signals that are inaudible to humans while the audio content is present. The reference audio signals can be in a frequency range inaudible to humans. The system can emit the reference audio signals through a loudspeaker coupled to the system, e.g., a built-in loudspeaker on a device, an external loudspeaker plugged into the device, or a loudspeaker wirelessly connected to the device. Emitting the reference audio signals can recur at a recurrence rate corresponding to a given time resolution. The reference audio signals can be above an upper limit of human hearing frequency range or below a lower limit of human hearing frequency range. The reference audio signals can be emitted at a same level across signals. Each of the reference audio signals includes a respective sweep. The sweep can be a linear sweep, or an exponential sweep, covering a frequency range that is between the upper limit of human audible frequency and one half of a loudspeaker sampling rate, respectively, e.g., between 20 kHz and 24 kHz. In some implementations, the reference audio signals include bursts of band-limited noise. In some implementations, the system can emit the reference audio signals continuously, allowing finest time resolution. The reference audio signals can include continuous narrow-band noise.

The system records (604), using a microphone, audio content and the reference audio signals. The recordings are referred to as recorded signals. The microphone can be a microphone coupled to the system, e.g., a built-in microphone on a device, an external microphone plugged into the device, or a microphone wirelessly connected to the device.

The system extracts (606) a representation of the reference audio signals from the recorded signals. The representation of the reference audio signals includes a series of IRs. Extracting the representation can include the following operations. The system convolves the recorded signals with an inverse sweep. The convolution filters out spectral components outside of a frequency range of the sweep. The system turns each sweep into a respective IR. In implementations where the reference audio signals include noise bursts, the system can extract the reference audio signals by filtering the input signal.

The system determines (608) variations over time in levels of the representation of the extracted reference audio signals.

The system infers (610), from the variations in levels, time-varying gains applied to the audio content. The system determines the inferred gains from amplitude of the produced IRs. Inferring the gains can occur in response to determining that each IR is above a threshold amplitude, to avoid mistaking an accidentally covered loudspeaker for high amount of gains.

The system provides (612) the time-varying gains and the audio content to a consuming device. The consuming device can be the device coupled to the loudspeaker and microphone, or another device. The consuming device can be a storage device, e.g., flash memory, a streaming service device, or a playback device.

In some implementations, the system can undo effects of the applied gains on the audio content. The system then provides the audio content, with the effects of the removed, to a storage device, a streaming server, or a playback device. Removing the gains can occur in response to determining that a level of the audio content is in a range where AGC would have been applied.

Exemplary Recording Device Architecture

Figure 7:
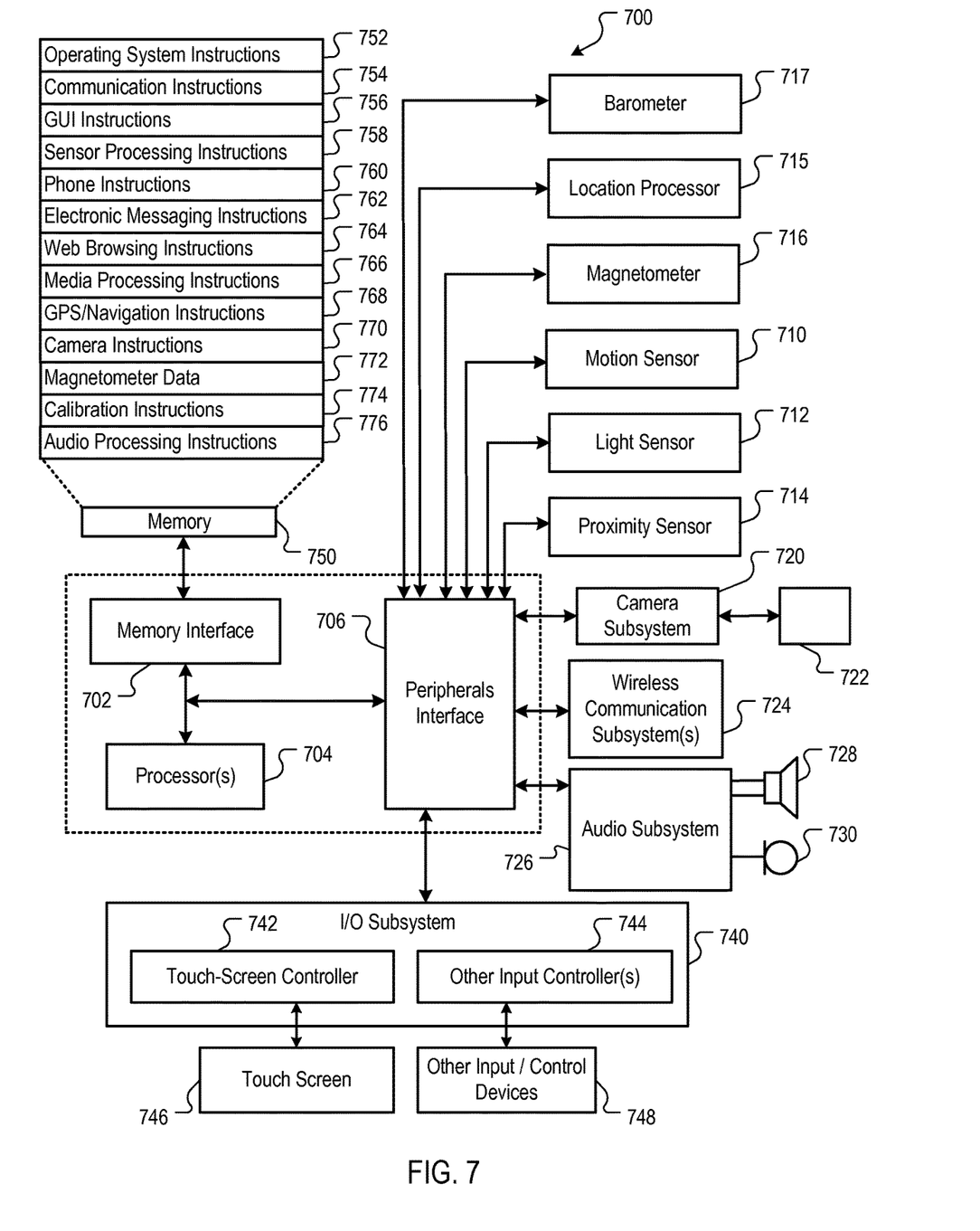
FIG. 7 is a block diagram illustrating an example device architecture of a mobile device implementing the features and operations described in reference to FIGS. 1-6.

FIG. 7 is a block diagram illustrating an exemplary device architecture 700 of a device implementing the features and operations described in reference to FIGS. 1-6. The device can be, for example, device 102 of FIG. 1. A device can include memory interface 702, one or more data processors, image processors and/or processors 704 and peripherals interface 706. Memory interface 702, one or more processors 704 and/or peripherals interface 706 can be separate components or can be integrated in one or more integrated circuits. Processors 704 can include application processors, baseband processors and wireless processors. The various components in the mobile device, for example, can be coupled by one or more communication buses or signal lines.

Sensors, devices and subsystems can be coupled to peripherals interface 706 to facilitate multiple functionalities. For example, motion sensor 710, light sensor 712 and proximity sensor 714 can be coupled to peripherals interface 706 to facilitate orientation, lighting and proximity functions of the mobile device. Location processor 715 can be connected to peripherals interface 706 to provide geopositioning. In some implementations, location processor 715 can be programmed to perform the operations of a GNSS receiver. Electronic magnetometer 716 (e.g., an integrated circuit chip) can also be connected to peripherals interface 706 to provide data that can be used to determine the direction of magnetic North. Thus, electronic magnetometer 716 can be used as an electronic compass. Motion sensor 710 can include one or more accelerometers configured to determine change of speed and direction of movement of the mobile device. Barometer 717 can include one or more devices connected to peripherals interface 706 and configured to measure pressure of atmosphere around the mobile device.

Camera subsystem 720 and an optical sensor 722, e.g., a charged coupled device (CCD) or a complementary metal-oxide semiconductor (CMOS) optical sensor, can be utilized to facilitate camera functions, such as recording photographs and video clips.

Communication functions can be facilitated through one or more wireless communication subsystems 724, which can include radio frequency receivers and transmitters and/or optical (e.g., infrared) receivers and transmitters. The specific design and implementation of the communication subsystem 724 can depend on the communication network(s) over which a mobile device is intended to operate. For example, a mobile device can include communication subsystems 724 designed to operate over a GSM network, a GPRS network, an EDGE network, a Wi-Fi™ or WiMax™ network and a Bluetooth™ network. In particular, the wireless communication subsystems 724 can include hosting protocols such that the mobile device can be configured as a base station for other wireless devices.

Audio subsystem 726 can be coupled to a loudspeaker 728 and a microphone 730 to facilitate voice-enabled functions, such as voice recognition, voice replication, digital recording and telephony functions. Audio subsystem 726 can be configured to receive voice commands from the user.

I/O subsystem 740 can include touch surface controller 742 and/or other input controller(s) 744. Touch surface controller 742 can be coupled to a touch surface 746 or pad. Touch surface 746 and touch surface controller 742 can, for example, detect contact and movement or break thereof using any of a plurality of touch sensitivity technologies, including but not limited to capacitive, resistive, infrared and surface acoustic wave technologies, as well as other proximity sensor arrays or other elements for determining one or more points of contact with touch surface 746. Touch surface 746 can include, for example, a touch screen.

Other input controller(s) 744 can be coupled to other input/control devices 748, such as one or more buttons, rocker switches, thumb-wheel, infrared port, USB port and/or a pointer device such as a stylus. The one or more buttons (not shown) can include an up/down button for volume control of loudspeaker 728 and/or microphone 730.

In one implementation, a pressing of the button for a first duration may disengage a lock of the touch surface 746; and a pressing of the button for a second duration that is longer than the first duration may turn power to the mobile device on or off. The user may be able to customize a functionality of one or more of the buttons. The touch surface 746 can, for example, also be used to implement virtual or soft buttons and/or a keyboard.

In some implementations, the mobile device can present recorded audio and/or video files, such as MP3, AAC and MPEG files. In some implementations, the mobile device can include the functionality of an MP3 player. Other input/output and control devices can also be used.

Memory interface 702 can be coupled to memory 750. Memory 750 can include high-speed random access memory and/or non-volatile memory, such as one or more magnetic disk storage devices, one or more optical storage devices and/or flash memory (e.g., NAND, NOR). Memory 750 can store operating system 752, such as iOS, Darwin, RTXC, LINUX, UNIX, OS X, WINDOWS, or an embedded operating system such as VxWorks. Operating system 752 may include instructions for handling basic system services and for performing hardware dependent tasks. In some implementations, operating system 752 can include a kernel (e.g., UNIX kernel).

Memory 750 may also store communication instructions 754 to facilitate communicating with one or more additional devices, one or more computers and/or one or more servers. Memory 750 may include graphical user interface instructions 756 to facilitate graphic user interface processing; sensor processing instructions 758 to facilitate sensor-related processing and functions; phone instructions 760 to facilitate phone-related processes and functions; electronic messaging instructions 762 to facilitate electronic-messaging related processes and functions; web browsing instructions 764 to facilitate web browsing-related processes and functions; media processing instructions 766 to facilitate media processing-related processes and functions; GNSS/Location instructions 768 to facilitate generic GNSS and location-related processes and instructions; camera instructions 770 to facilitate camera-related processes and functions; magnetometer data 772 and calibration instructions 774 to facilitate magnetometer calibration. The memory 750 may also store other software instructions (not shown), such as security instructions, web video instructions to facilitate web video-related processes and functions and/or web shopping instructions to facilitate web shopping-related processes and functions. In some implementations, the media processing instructions 766 are divided into audio processing instructions and video processing instructions to facilitate audio processing-related processes and functions and video processing-related processes and functions, respectively. An activation record and International Mobile Equipment Identity (IMEI) or similar hardware identifier can also be stored in memory 750. Memory 750 can store audio processing instructions 776 that, when executed by processor 704, can cause processor 704 to perform various operations including, for example, the operations of the AGC inference module 116 of FIG. 1 and FIG. 4.

Each of the above identified instructions and applications can correspond to a set of instructions for performing one or more functions described above. These instructions need not be implemented as separate software programs, procedures, or modules. Memory 750 can include additional instructions or fewer instructions. Furthermore, various functions of the mobile device may be implemented in hardware and/or in software, including in one or more signal processing and/or application specific integrated circuits.

Figure 8:
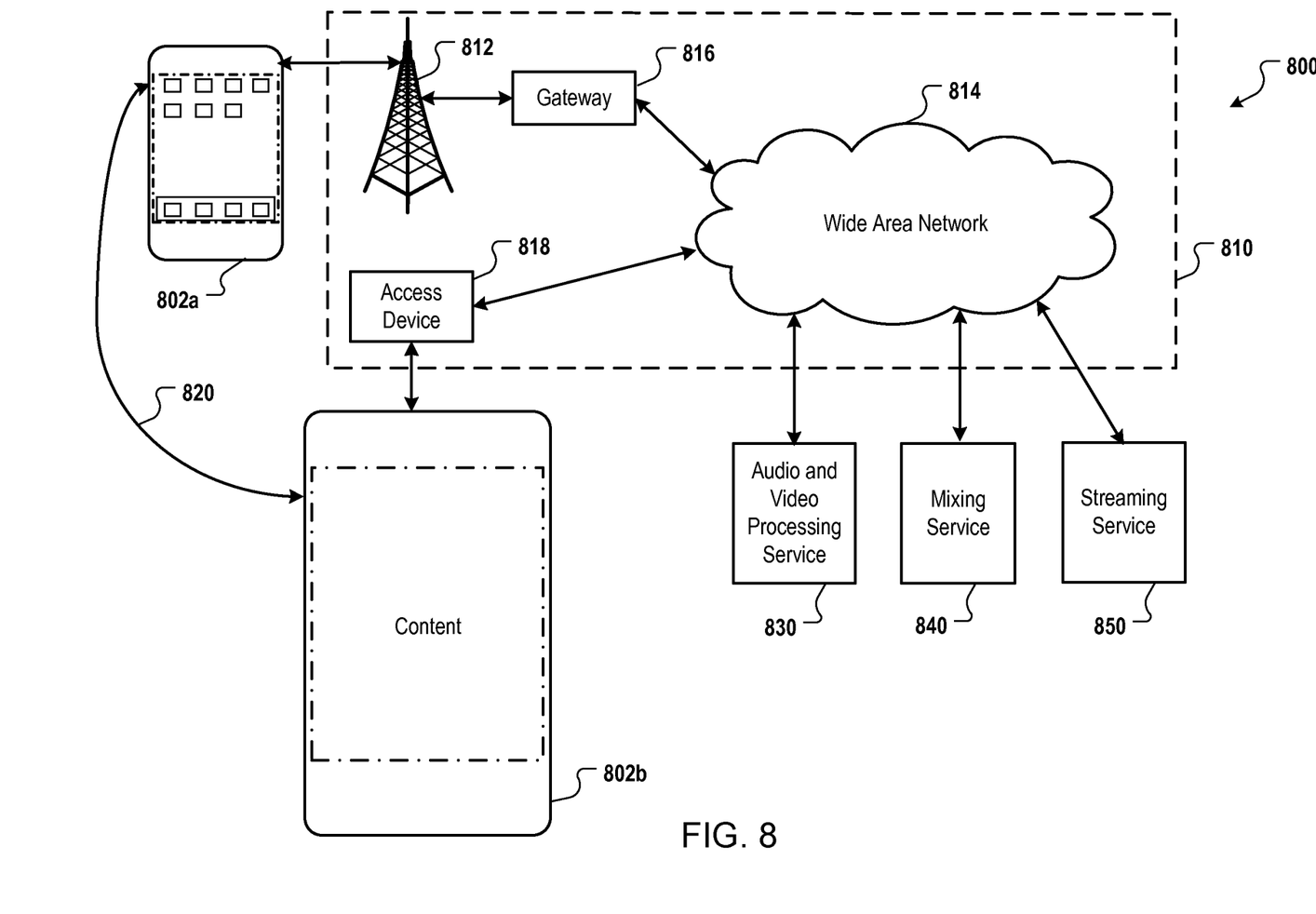
FIG. 8 is a block diagram of an example network operating environment for the devices in FIGS. 1-6.

FIG. 8 is a block diagram of an example network operating environment 800 for the devices of FIGS. 1-6. Devices 802a and 802b can, for example, communicate over one or more wired and/or wireless networks 810 in data communication. For example, a wireless network 812, e.g., a cellular network, can communicate with a wide area network (WAN) 814, such as the Internet, by use of a gateway 816. Likewise, an access device 818, such as an 802.11g wireless access point, can provide communication access to the wide area network 814. Each of devices 802a and 802b can be the device 102 of FIG. 1.

In some implementations, both voice and data communications can be established over wireless network 812 and the access device 818. For example, device 802a can place and receive phone calls (e.g., using voice over Internet Protocol (VoIP) protocols), send and receive e-mail messages (e.g., using Post Office Protocol 3 (POP3)), and retrieve electronic documents and/or streams, such as web pages, photographs, and videos, over wireless network 812, gateway 816, and wide area network 814 (e.g., using Transmission Control Protocol/Internet Protocol (TCP/IP) or User Datagram Protocol (UDP)). Likewise, in some implementations, the device 802b can place and receive phone calls, send and receive e-mail messages, and retrieve electronic documents over the access device 818 and the wide area network 814. In some implementations, device 802a or 802b can be physically connected to the access device 818 using one or more cables and the access device 818 can be a personal computer. In this configuration, device 802a or 802b can be referred to as a "tethered" device.

Devices 802a and 802b can also establish communications by other means. For example, wireless device 802a can communicate with other wireless devices, e.g., other mobile devices, cell phones, etc., over the wireless network 812. Likewise, devices 802a and 802b can establish peer-to-peer communications 820, e.g., a personal area network, by use of one or more communication subsystems, such as the Bluetooth™ communication devices. Other communication protocols and topologies can also be implemented.

The device 802a or 802b can, for example, communicate with one or more services 830, 840 and 850 over the one or more wired and/or wireless networks. For example, one or more audio and video processing services 830 can provide services of audio processing including undoing effects of AGC from audio content based on inferred AGC, as described above. Mixing service 840 can provide user interfaces that allow a mixing professional to log in through a remote console to perform post-recording mixing operations on audio content. Streaming service 850 can provide user interfaces that allow a user device to download or stream mixed audio content where AGC effect that was forced on the audio content has been undone.

Device 802a or 802b can also access other data and content over the one or more wired and/or wireless networks. For example, content publishers, such as news sites, Really Simple Syndication (RSS) feeds, web sites, blogs, social networking sites, developer networks, etc., can be accessed by device 802a or 802b. Such access can be provided by invocation of a web browsing function or application (e.g., a browser) in response to a user touching, for example, a Web object.

A number of implementations of the invention have been described. Nevertheless, it will be understood that various modifications can be made without departing from the spirit and scope of the invention.

The invention claimed is:

1. A method comprising:
generating, on a device capturing audio content, reference audio signals that are, while the audio content is present, inaudible to humans;
driving a loudspeaker, coupled to the device, to emit the reference audio signals;
simultaneously capturing as captured signals, through a microphone and associated Analog-to-Digital converter coupled to the device, the audio content and the reference audio signals; wherein capturing includes applying a common time-varying gain to the audio content and the reference audio signals;
extracting a representation of the reference audio signals from the captured signals;
determining variations over time in levels of the representation of the extracted reference audio signals;
inferring, from the variations in levels, the time-varying gain that has been applied to the audio content during the capturing; and
providing information on the inferred time-varying gain to another device.

2. The method of claim 1, wherein emitting the reference audio signals recurs at a rate corresponding to a given time resolution.

3. The method of claim 1, wherein emitting the reference audio signals occurs continuously.

4. The method of claim 1, wherein the reference audio signals are above an upper limit or below a lower limit of human hearing frequency range.

5. The method of claim 1, wherein the reference audio signals are at a same level.

6. The method of claim 1, wherein each of the reference audio signals includes a sweep.

7. The method of claim 6, wherein each sweep is an exponential sweep that is ultrasonic and below a half of sampling rate of the loudspeaker.

8. The method of claim 7, wherein the inferred time-varying gain is determined from convolving the produced impulse responses with pink or white noise and measuring the corresponding root mean square of the convolved signal.

9. The method of claim 6, wherein:
the representation of the reference audio signals includes a series of impulse responses, and
extracting the representation of the reference audio signals comprises convolving the recorded signals with an inverse sweep, producing an impulse response for each sweep.

10. The method of claim 9, wherein the inferred time-varying gain is determined from the amplitude of the produced impulse responses.

11. The method of claim 1, comprising:
undoing effects of the applied time-varying gain on the audio content by a consuming device; and
providing the audio content, with the effects of the applied time-varying gain removed, to a storage device, a streaming server, or a playback device.

12. The method of claim 11, wherein removing the effects of the applied time-varying gain is in response to determining that a level of the audio content is in a range where automatic gain compensation would have been applied.

13. A system comprising:
a loudspeaker;
a microphone
one or more processors; and
a non-transitory computer-readable medium storing instructions that, when executed by the one or more processors, cause the one or more processors to perform the method of claim 1.

14. A non-transitory computer-readable medium storing instructions that, when executed by one or more processors of an audio system, cause the one or more processors to perform the method of claim 1.

15. A device for determining a time-varying gain applied to audio content during recording, the device comprising:
a reference signal generator configured to generate reference audio signals that are, while the audio content is present, inaudible to humans, for emission through a loudspeaker coupled to the device,
a recording interface configured to receive captured signals comprising the audio content and the reference audio signals after the time-varying gain has been concurrently applied to the audio content and the reference audio signals;
a reference signal extractor configured to determine a representation of the reference audio signals from the captured signals;
a gain analyzer configured to infer the time-varying gain that has been applied to the audio content during the recording from levels of the representation of the reference audio signals; and
a gain output configured to output a signal representative of the inferred time-varying gain to another device.

16. The device of claim 15 further comprising a speaker driver receiving the reference audio signals and configured to drive the loudspeaker coupled to the device for emission of the reference audio signals.

* * * * *